(12) United States Patent
Karthikeyan et al.

(10) Patent No.: US 11,307,632 B2
(45) Date of Patent: Apr. 19, 2022

(54) POWER DISABLE OF MEMORY SUB-SYSTEM

(71) Applicant: Micron Technology, Inc., Boise, ID (US)

(72) Inventors: Manohar Karthikeyan, Longmont, CO (US); Mehdi Partou, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 48 days.

(21) Appl. No.: 16/714,503

(22) Filed: Dec. 13, 2019

(65) Prior Publication Data

US 2021/0124409 A1   Apr. 29, 2021

Related U.S. Application Data

(60) Provisional application No. 62/924,866, filed on Oct. 23, 2019.

(51) Int. Cl.

| | |
|---|---|
| *G06F 1/32* | (2019.01) |
| *G06F 1/14* | (2006.01) |
| *G11C 7/10* | (2006.01) |
| *G06F 1/3225* | (2019.01) |
| *G06F 1/3234* | (2019.01) |
| *G06F 1/3246* | (2019.01) |

(52) U.S. Cl.
CPC .............. *G06F 1/3225* (2013.01); *G06F 1/14* (2013.01); *G06F 1/3246* (2013.01); *G06F 1/3253* (2013.01); *G06F 1/3275* (2013.01); *G11C 7/106* (2013.01); *G11C 7/1087* (2013.01)

(58) Field of Classification Search
CPC .... G06F 1/3225; G06F 1/3246; G06F 1/3253; G06F 1/3275; G06F 1/14; G11C 7/106; G11C 7/1087
See application file for complete search history.

(56) References Cited

U.S. PATENT DOCUMENTS

| | | |
|---|---|---|
| 2010/0057970 A1 | 3/2010 | Kashi et al. |
| 2013/0073889 A1 | 3/2013 | Rauschmayer et al. |
| 2016/0124487 A1* | 5/2016 | Kunishige .............. G06F 1/3221 713/330 |

(Continued)

OTHER PUBLICATIONS

International Search Report and Written Opinion dated Jan. 29, 2021 in Patent Application No. PCT/US2020/056889.

*Primary Examiner* — Jaweed A Abbaszadeh
*Assistant Examiner* — Cheri L Harrington
(74) *Attorney, Agent, or Firm* — Lowenstein Sandler LLP

(57) ABSTRACT

A system includes a memory device and a power disable circuit coupled to a bus connector and to power circuitry adapted to power on and off the memory device. A processing device is coupled to the bus connector, to the power disable circuit, and to the memory device. The processing device is to monitor a state of a power disable (PWDIS) signal of the bus connector while the PWDIS signal is at a first voltage level, and in response to the PWDIS signal transitioning to a second voltage level, determine whether a length of time for which the PWDIS signal has been at the second voltage level satisfies a threshold criterion. In response to the length of time for which the PWDIS signal has been at the second voltage level satisfying the threshold criterion, the processing device is to enable the power disable circuit with a general purpose input/output signal.

17 Claims, 9 Drawing Sheets

(56) References Cited

U.S. PATENT DOCUMENTS

| | | | |
|---|---|---|---|
| 2016/0181801 A1* | 6/2016 | Shimizu | G06F 1/26 |
| | | | 307/19 |
| 2018/0239696 A1* | 8/2018 | Lim | G06F 3/0635 |
| 2019/0050034 A1* | 2/2019 | Wang | G06F 3/065 |
| 2019/0022761 A1 | 7/2019 | Rinaldi et al. | |
| 2019/0227611 A1* | 7/2019 | Nam | G06F 1/3268 |

* cited by examiner

POWER DISABLE OF MEMORY SUB-SYSTEM

RELATED APPLICATIONS

This application claims benefit under 35 U.S. C. § 119(e) of U.S. Provisional Patent Application No. 62/924,866, filed Oct. 23, 2019, which is incorporated herein by this reference in its entirety.

TECHNICAL FIELD

Embodiments of the disclosure relate generally to memory sub-systems, and more specifically, related to power disable of a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to circuitry and related firmware functionality to support power disable of a memory sub-system. A memory sub-system can be a storage device, a memory module, or a hybrid of a storage device and memory module. Examples of storage devices and memory modules are described below in conjunction with FIG. 1A. In general, a host system can utilize a memory sub-system that includes one or more memory components or devices. The host system can provide data to be stored at the memory sub-system and can request data to be retrieved from the memory sub-system.

The memory sub-system can include multiple memory components or memory devices that can store data from the host system. In bus connectors, such as interfaces for serial and parallel AT attachments (e.g., SATA, PATA), a power disable feature, if supported and enabled, can be used to disable power to device circuitry. For example, when SATA connector Pin3 (e.g., Power Disable (PWDIS) Pin), is negated for a few seconds defined by $T_{HN}$, and then asserted (defined by $T_{HA}$), the SATA solid state drive (SSD) should power cycle. Table 1 illustrates PWDIS protocol for Serial ATA Revision 3.3 Gold by way of example. Other power disable protocols (existing or to be created) are envisioned by the present disclosure.

Figure 1A:
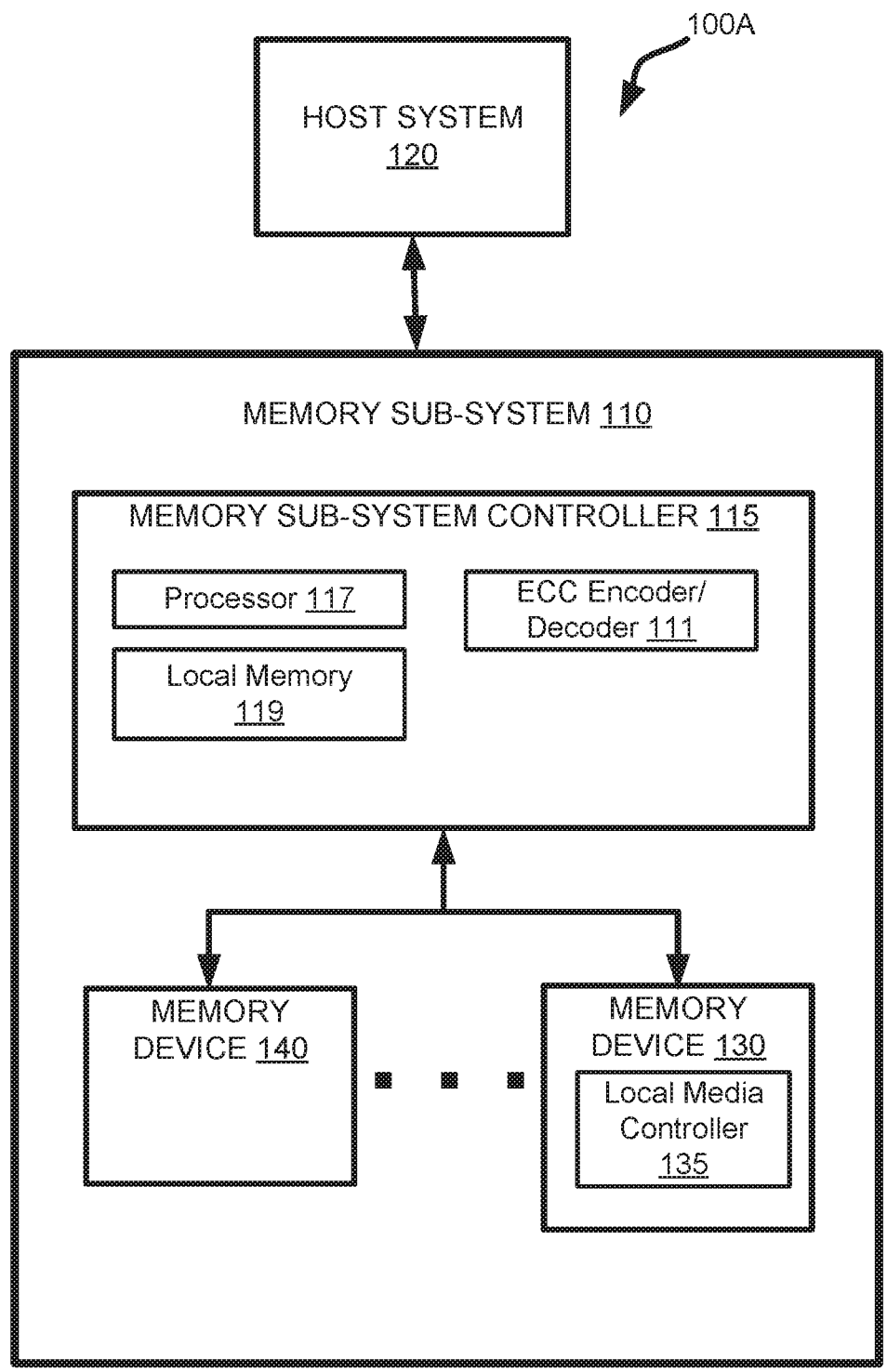
FIG. 1A illustrates an example computing environment that includes a memory sub-system according to embodiments of the present disclosure.
Figure 1B:
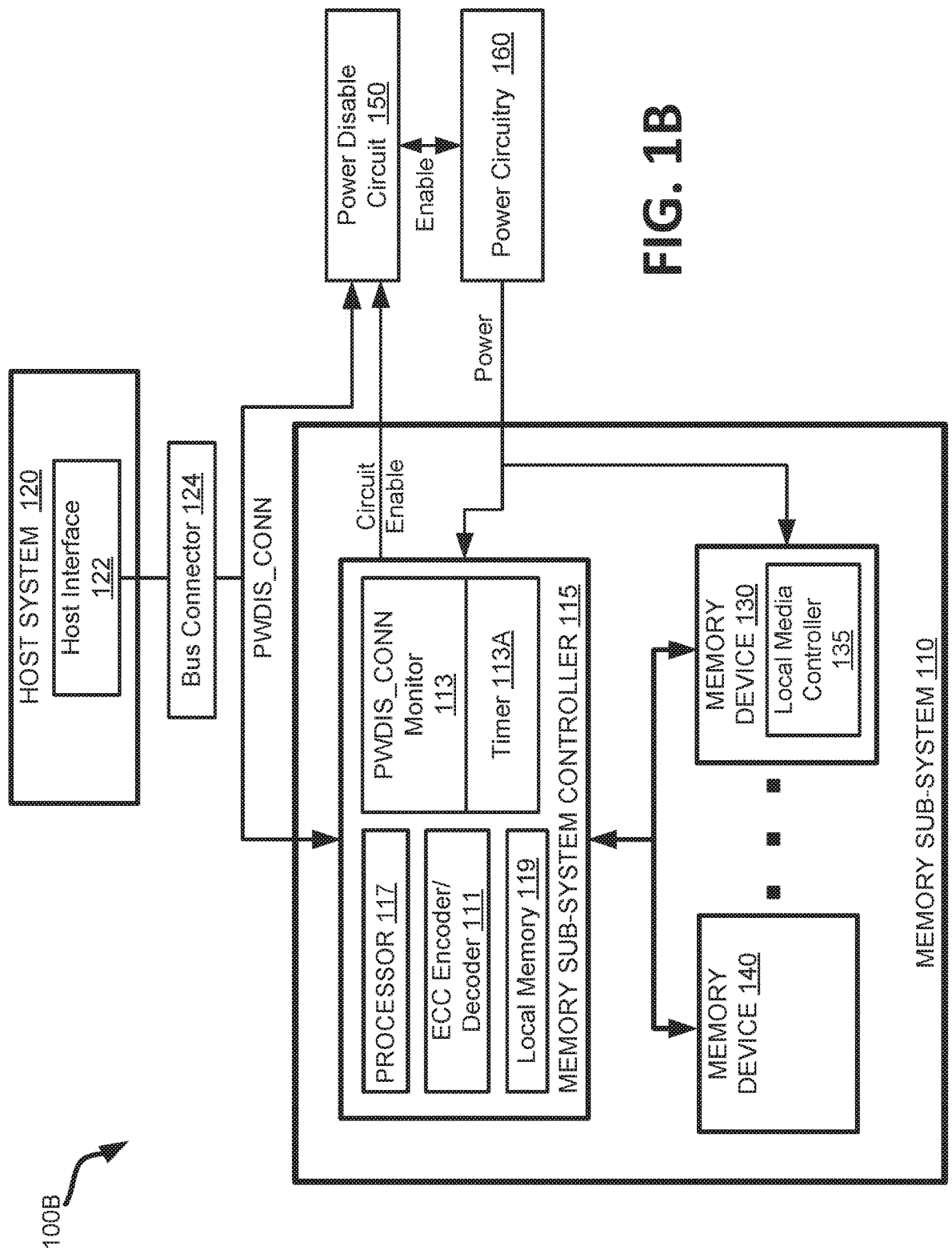
FIG. 1B illustrates a more detailed computing environment that includes the memory sub-system and power disable circuitry according to an embodiment.

Customers are primarily motivated to use this PWDIS feature to turn off power to the memory sub-system remotely without the need of operator access to the individual memory sub-system, e.g., a storage device or drive. This feature can be used to remotely turn off or cut power to the memory sub-systems in situations where the memory sub-system is in an undesirable state and may need to be powered off or cycled back on. While reference is primarily made to SSD as the memory sub-system, remotely disabling power of other memory sub-systems or devices is envisioned. Turning off or cutting power from the memory sub-system can be understood to include disconnecting power from a processing device and memory device of the memory sub-system, as illustrated in FIG. 1A and FIG. 1B.

TABLE 1

| Parameter | Characteristic | Units | Minimum | Maximum |
|---|---|---|---|---|
| $V_{DIn}$ | Absolute maximum voltage input range | V | −0.5 | 3.6 |
| $V_{HNegate}$ | Negated voltage (power enabled) [a,b] | V | −0.5 | 0.7 |
| $V_{HAssert}$ | Asserted voltage (power disabled) [c] | V | 2.1 | 3.6 |
| $A_{DSSCC}$ | Driver sink/source current capability [b,c] | uA | 100 | — |
| $T_{HA}$ | PWDIS asserted hold time [d,e] | s | 5.0 | — |
| $T_{HN}$ | PWDIS negated hold time [d,e] | s | 30.0 | — |

[a] The device shall allow power to be applied to the device crcuitery if P3 is not connected on the host connector.
[b] The PWDIS signal shall be actively negated.
[c] The PWDIS signal shall be actively asserted.
[d] The hold time is the length of time the PWDIS signal is asserted or negated. The length of time after the PWDIS signai is asserted or negated until the disabling or allowing of power to the device circuitry is vendor specific.
[e] The PWDIS signal should not transition from negated to asserted or asserted to negated for the negated hold time:
a) after power is applied to the host connector; or
b) after the detection of a hot plug event.

In some embodiments, the power disable feature can be enabled via a combination of firmware execution of a memory controller and hardware provided within a memory sub-system. In one embodiment, the firmware monitors the PWDIS (or P3 pin) signal and related registers. If the PWDIS signal is supported and timing requirements of the PWDIS being low is met, the controller can enable a power disable circuit to perform further PWDIS signal monitoring, e.g., in order to detect when to power off and power back up the memory sub-system or device even in the absence of power at the controller.

In one embodiment, a system can include a memory device and a power disable circuit coupled to a bus connector of a host system and coupled to power circuitry adapted to power on (and off) at least a processing device (e.g., controller) and the memory device of the memory sub-system. The processing device can be operatively coupled to the bus connector, to the power disable circuit, and to the storage device. The processing device can be adapted to monitor a status of a power disable (PWDIS) signal of the bus connector (e.g., at the P3 pin for SATA) while the PWDIS signal is at a high voltage level. In response to the PWDIS signal going to a low voltage level, the processing device can use a timer (or the like) to determine whether the length of time for which the PWDIS signal has been at the low voltage level satisfied a threshold criterion. In one embodiment, this length of time (to satisfy the threshold criterion) is at least 30 seconds but may extend to a longer period of time (e.g., up to 60 seconds or more) depending on vendor or implementation. The processing device can further, in response to the length of time for which the PWDIS signal has been at the low voltage level satisfying the threshold criterion, enable the power disable circuit via a general purpose input/output signal (GPIO).

In various embodiments, once enabled, the power disable circuit can monitor for the PWDIS signal going back to the high voltage level, in response to which the power disable circuit is to cut power to the memory sub-system, e.g., the processing device and the memory device. Further, during initial power up of the memory sub-system, the power disable circuit can be adapted to ignore a state of the PWDIS signal, and thus a legacy memory sub-system can still be employed. While "high voltage level" and "low voltage level" are referred to herein, these could be reversed with updated logic as will be discussed.

Advantages of the present disclosure include but are not limited to the ability to remotely power off and/or power off and then power back on (e.g., cycle power) of a memory sub-system. The disclosed embodiments allow performing such power cutting (or cycling) even in a legacy device where PWDIS may not be supported and/or enabled. In this way, power disable features can be selectively enabled on a range of devices according to manufacture or operator requirements. Other advantages will be apparent to those skilled in the art of power disable features of a memory sub-system discussed hereinafter.

FIG. 1A illustrates an example computing system 100A that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such. Each memory device 130 or 140 can be one or more memory component(s).

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and a non-volatile dual in-line memory module (NVDIMM).

The computing system 100A can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100A can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components or devices, which can be an indirect communicative connection or direct communicative connection (e.g., without intervening components or devices), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface, which may communicate over a system bus 150. Examples of a physical host interface include, but are not limited to, a serial advanced technology attachment (SATA) interface, a peripheral component interconnect express (PCIe) interface, universal serial bus (USB) interface, Fibre Channel, Small Computer System Interface (SCSI), Serial Attached SCSI (SAS), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) negative- and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point type and NAND type memory are described, the memory device 130 can be based on any other type of non-volatile memory, such as read-only memory (ROM), phase change memory (PCM), self-selecting memory, other chalcogenide based memories, ferroelectric random access memory (FeRAM), magneto random access memory (MRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

In some embodiments, the controller 115 includes an error-correcting code (ECC) encoder/decoder 111. The ECC encoder/decoder 111 can perform ECC encoding for data written to the memory devices 130 and ECC decoding for data read from the memory devices 130, respectively. The ECC decoding can be performed to decode an ECC codeword to correct errors in the raw read data, and in many cases also to report the number of bit errors in the raw read data.

FIG. 1B illustrates a more detailed computing environment 100B that includes the memory sub-system 110 and power disable circuitry according to an embodiment. In disclosed embodiments, the host system 120 may include a physical host interface 122 (referred to above) coupled to a bus connector 124 of the computing environment 110B. Examples of the physical host interface 122 include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface 122 can be used to transmit data between the host system 120 and the memory sub-system 110 via the bus connector 124, for example.

The computing environment 100B can further include a power disable circuit 150 coupled to power circuitry 160, both of which are coupled to the memory sub-system 110, as illustrated. The power circuitry 160, which will be discussed in more detail with reference to FIGS. 3A-3C, can be adapted to receive a general purpose input/output (GPIO) or other enable signal from the controller 115 to receive handoff of monitoring the power disable signal (PWDIS) signal from the controller 115. The power disable circuit 150 can further execute the power off and optional cycling back on of the power to the memory device 130 or 140 by triggering the power circuitry 160 accordingly. The power circuitry 160 can thus be adapted to respond to a power on/off signal from the power disable circuit 150 and turn power off (or back on) to the controller 115 and the memory devices 130 and/or 140 accordingly. In one embodiment, the power circuitry 160 is the MP5505, a high-efficiency energy storage and management unit for SSD applications.

The controller 115 can further include a power disable connector (PWDIS) monitor 113 (or PWDIS_CONN monitor) to detect a voltage level of the PWDIS signal from the bus connector 124. That voltage level can be a first voltage level (e.g., high in one embodiment) or a second voltage level (e.g., low in one embodiment). These are the voltage levels of current PWDIS protocol. If logic is updated (changed from the current protocol) to respond to reversed voltage levels, the first voltage level could be swapped with the second voltage level. Thus, in the present disclosure, what can be viewed as relevant is the transition between voltage levels, as will be discussed in detail, according to a PWDIS protocol employed with a PWDIS signal over the bus connector 124. The PWDIS connector monitor 113 can further include or be coupled to a timer 113A used to determine how long the PWDIS signal is at a second or low voltage level before sending a GPIO (or other) signal to the power disable circuit 150, to enable or activate the power disable circuit 150 for power disablement purposes. Functioning of the PWDIS connector monitor 113 and timer 113A will be discussed in more detail later.

Figure 2:
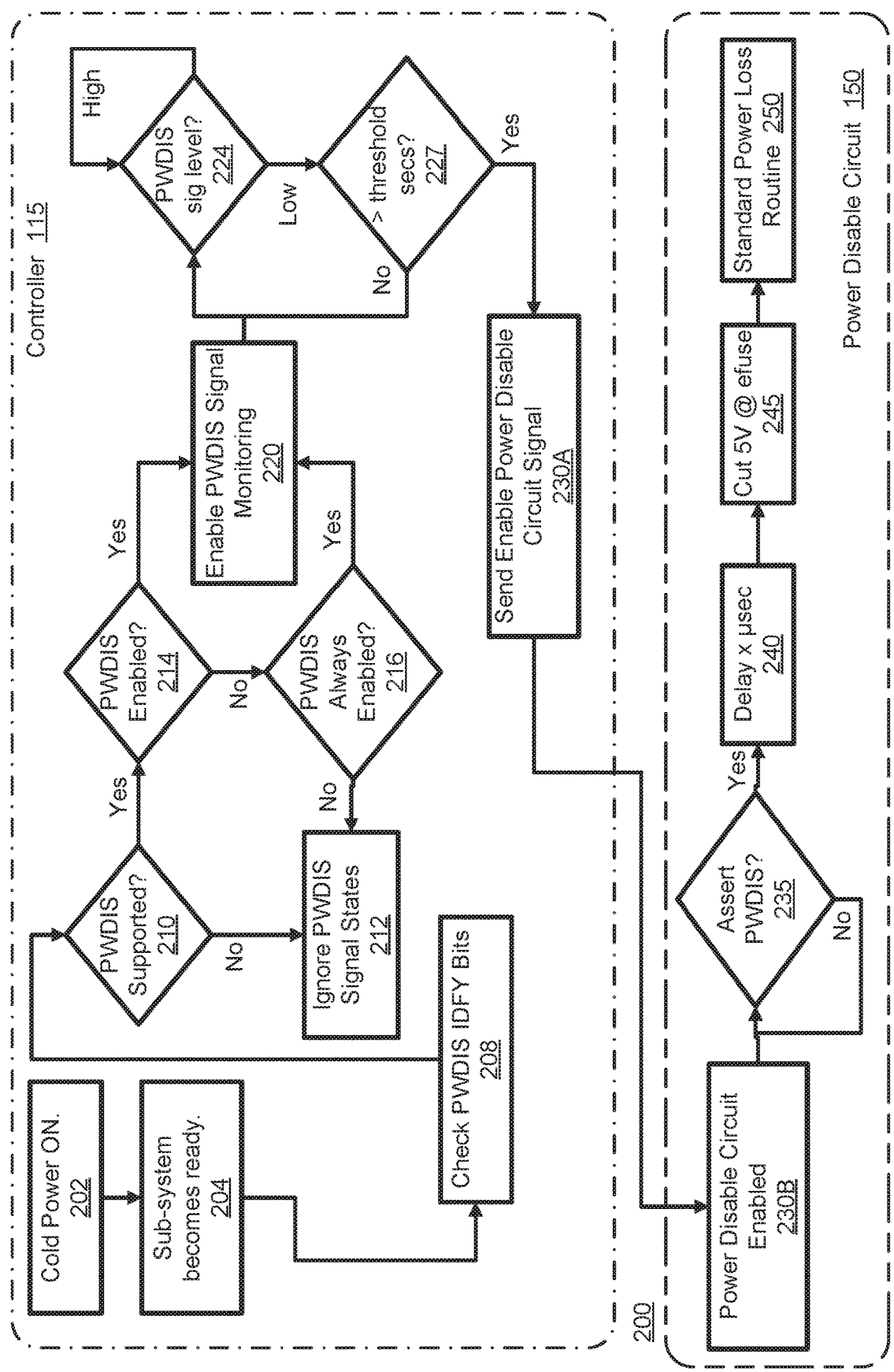
FIG. 2 is a flow chart of a method that illustrates interplay between firmware of a controller and a power disable circuit to support power disable of the memory sub-system according to an embodiment.

FIG. 2 is a flow chart of a method 200 that illustrates interplay between firmware of a controller and a power disable circuit to support a power disable feature of a memory sub-system according to an embodiment. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the controller 115 (e.g., the PWDIS connector monitor 113) of FIG. 1A. Other portions of the method 200 can be performed by the power disable circuit 150 and optionally also the power circuitry 160. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

With reference to FIG. 2, at operation 202, processing logic performs a cold power on, e.g., an initial power up of the memory sub-system 110. At operation 204, the processing logic detects that the memory sub-system becomes ready. At operation 208, the processing logic checks on PWDIS identification bits from the controller 115, e.g., that can be stored in a local register or the local memory 119. The PWDIS identification bits can indicate whether PWDIS protocol is supported and, if supported, enabled. At operation 210, the processing logic determines whether PWDIS is supported, e.g., depending on a state of the PWDIS identification bits. If PWDIS is not supported, at operation 212, the processing logic ignores states of the PWDIS signal (e.g., from the P3 pin of the bus connector).

If PWDIS is supported, at operation 214, the processing logic determines whether PWDIS has been enabled, e.g., depending on a state of the PWDIS identification bits. If PWDIS has not been enabled, at operation 216, the processing logic determines whether PWDIS is always enabled. If PWDIS is not always enabled, at operation 212, the processing logic ignores states of the PWDIS signal, e.g., that comes from the P3 pin of the bus connector 124.

If PWDIS is enabled (operation 214) or is always enabled (operation 216), at operation 220, the processing logic enables PWDIS signal monitoring. If the PWDIS signal is to be monitored, at operation 224, the processing logic determines whether the PWDIS signal voltage level is high or low, e.g., a first voltage level or a second voltage level, respectively. If at the high voltage level, at operation 224, the processing logic continues monitoring the PWDIS signal. If the processing logic detects the PWDIS signal transition to the low voltage level, at operation 227, the processing logic uses the timer 118A to determine whether the length of time for which the PWDIS signal has been at the low voltage level satisfies a threshold criterion (e.g., reached 30 seconds, 40 seconds, 60 seconds, or the like). If the length of time for which the PWDIS signal has been at the low voltage level has satisfied the threshold criterion, at operation 230A, the processing logic sends a GPIO (or other enablement) signal to enable the power disable circuit 150.

With continued reference to FIG. 2, at operation 230B, the power disable circuit 150 is enabled upon receipt of the GPIO or other enablement signal. At operation 235, the processing logic determines whether the PWDIS signal has been asserted (see, for example, Table 1). Once the PWDIS signal has been asserted, at operation 240, the processing logic delays the PWDIS signal coming into the power disable circuit by a certain number (e.g., at least one, one and a half, two, or more) of microseconds. This is to perform deglitch of the incoming PWDIS signal. If asserted and following the deglitch delay, at operation 245, the processing logic cuts off a five volt power source at an electrical fuse. At operation 250, the processing logic performs a standard power loss routine to power down the controller 115 (e.g., processing device) and the memory device 130 or 140, for example. At operation 250, this standard power loss routing can include the processing logic sending a signal to the power circuitry 160 to cause the power circuitry 160 to take over cutting power to the controller 115 and memory device 130 or 140. Until firmware of the controller 115 hands off monitoring to the power disable circuit 150 via the GPIO signal, the power disable circuit 150 can ignore the PWDIS signal.

Figure 3A:
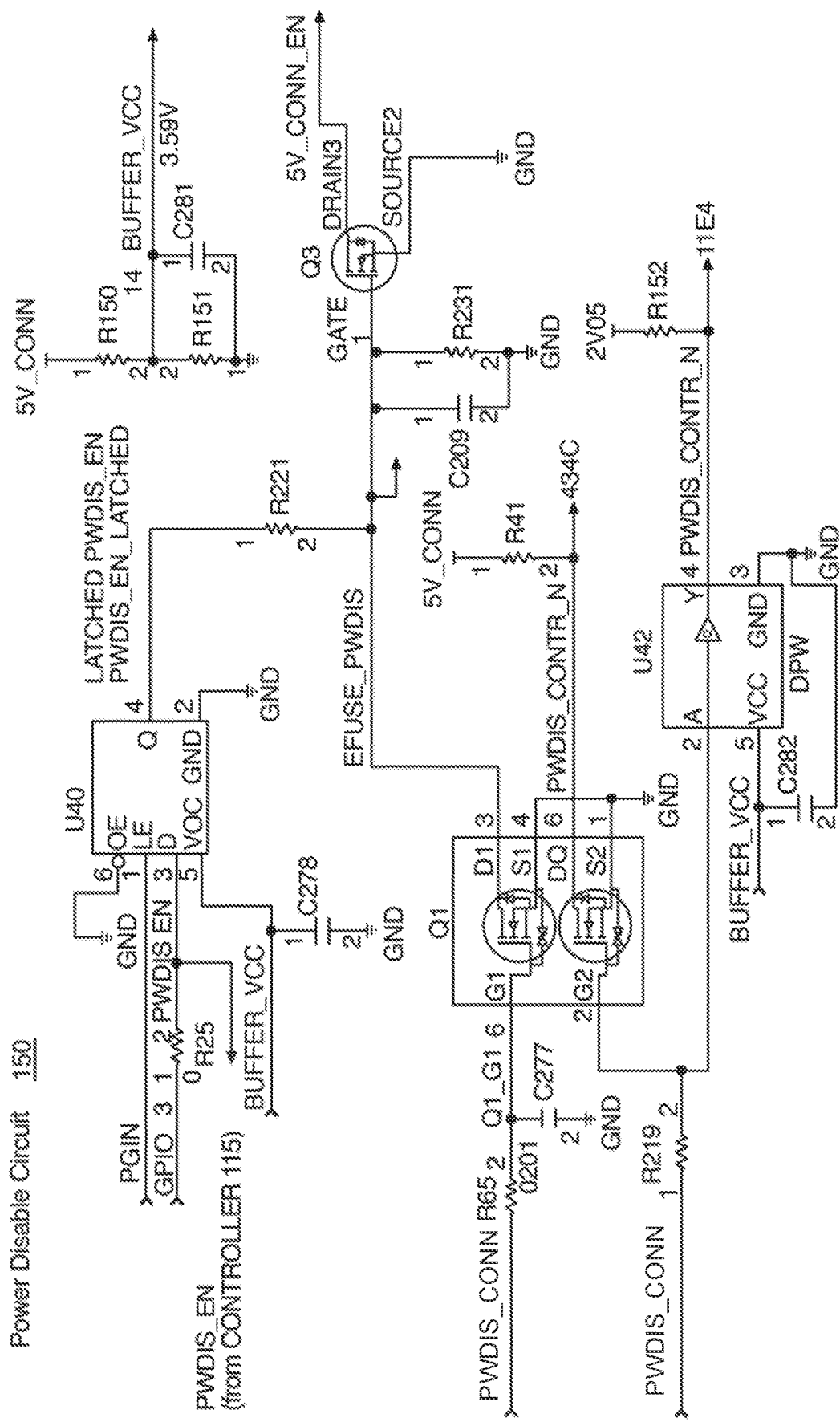
FIGS. 3A-3C are a schematic diagram of a power disable circuit according to some embodiments.
Figure 3B:
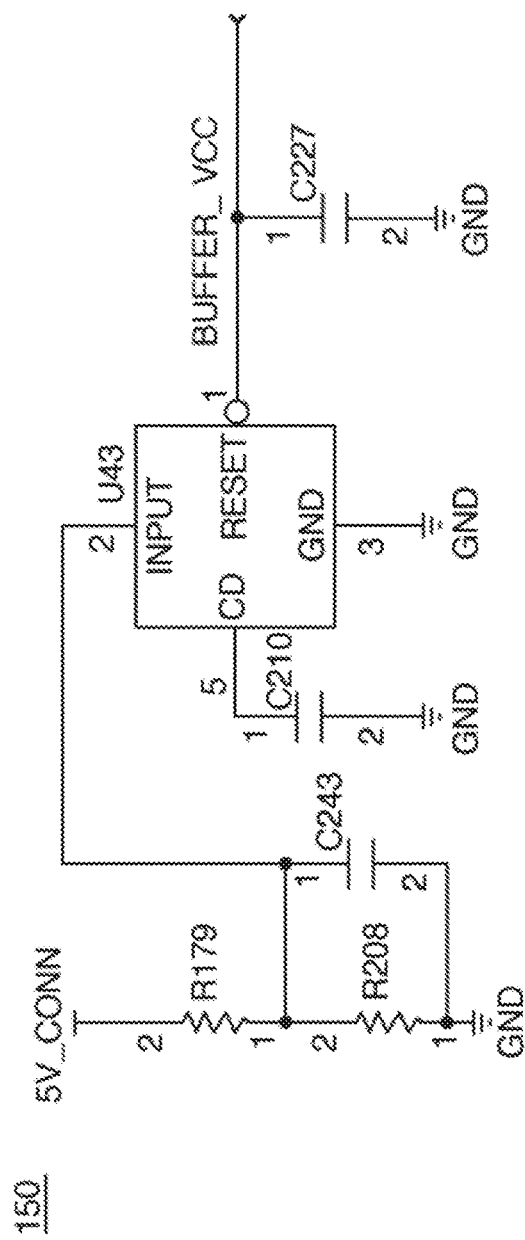
Figure 3C:
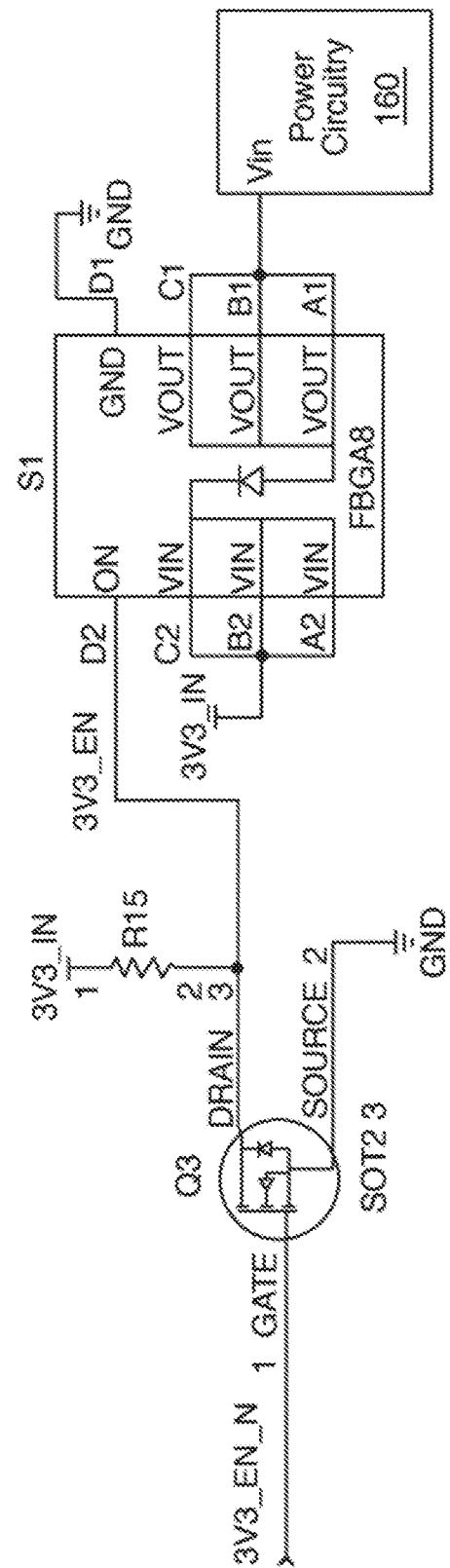

FIGS. 3A-3C are a schematic diagram of the power disable circuit 150 according to some embodiments. In various embodiments, the power disable circuit 150 includes a latch circuit U40 (which can be a D-type latch or other type of latch, for example), a set of field effect transistors (FETs) Q1, a voltage buffer U42, and a voltage supervisor U43. In one embodiment, the latch circuit U40 is to latch the PWDIS enable (PWDIS_EN) GPIO output signal at a high voltage level when the storage device 130 or 140 goes to no power mode in response to the PWDIS signal (e.g., PWDIS_CONN in FIG. 3A) being asserted. Consequently, the power disable circuit 150 can remain powered and enabled even though power is removed from the controller 115 and hence its GPIO transitions to a low voltage level. As a result, the power disable circuit 150 can directly react to the PWDIS signal and keep the power disconnected as long as the PWDIS signal remains asserted (high voltage level per Table 1) and restore power to storage device 130 as soon as the PWDIS signal is negated (low voltage level as per Table 1).

In disclosed embodiments, the PGIN signal of the latch circuit U40 references the power good signal from the power circuitry 160 (FIG. 1B) that is to indicate the input power is at or below an acceptable threshold value.

In various embodiments of the power disable circuit 150, because the latch enable (LE) and D inputs to the latch circuit U40 are 2.85V signal levels, VCC is not to be directly connected to 5V_CONN because VCC can set VIH levels above acceptable range. The power disable circuit 150 can further include a voltage divider (R150/R151) from 5V to 3V to address this issue. Since the current drawn from the latch circuit U40 is limited by R221 (which can be, e.g., 47.5 k ohms) to approximately 70 micro amps, it is expected to see any current/resistive (IR) drop issues and thus capacitor C278 can be placed to provide noise decoupling as well as electrical charge during signal transitions.

In disclosed embodiments, resistors (R41+R65) and a capacitor C277 can provide deglitch delay (e.g., an RC delay) on the falling edge of the PWDIS_CONN signal during power restore. Further, resistor R65 and capacitor C277 can provide deglitch delay on the rising edge of the PWDIS signal (e.g., PWDIS_CONN in FIG. 3A) during power shutdown. A power restore and power down sequence can be triggered by asserting/de-asserting the 5V_CONN_EN signal, which controls the enable signal of an electrical fuse (EFUSE) to trigger the power circuitry 160 (FIG. 1B).

The power disable circuit 150 can further include a set of field effect transistor (FETs), including a first FET (with first gate G1, first drain D1, and first source 51) and a second FET (with second gate G2, second drain D2, and second source S2) within component Q1, where sources of the first and second FETs are mutually coupled. The PWDIS signal (e.g., PWDIS_CONN) can be received at the first and second gates of the first and second FETs. A third FET (Q3) can have a gate that is coupled to the output (pin Q) of the latch circuit U40 and to the first drain of the first FET. The power disable circuit 150 can ignore the state of the PWDIS signal during the first-time or initial power up. Hence, an SSD designed according to the memory sub-system 110 disclosed herein can be plugged into a host that does not also support a power disable feature.

In disclosed embodiments, once the power disable circuit 150 is enabled are previously described, the power disable circuit 150 can monitor for the PWDIS signal (e.g., PWDIS_CONN in FIG. 3A) to go to a high voltage level. The gate of a third field effect transistor (FET) Q3 is to be at a high voltage level to signal to the power circuitry 160 to turn off (or cut) power to the controller 115 and memory device 130 or 140. Until and while the PWDIS signal is low (e.g., at a low voltage level), the first drain of the first FET is low (e.g., at the second voltage level). This means the gate of the third FET Q3 is low and hence the power is not cut. Once the PWDIS signal transitions high (e.g., to the first or high voltage level), the first drain of the first FET is left floating. The output (pin Q) of the latch circuit U40 can be high because the controller 115 has now enabled pin Q with the GPIO signal. This means the gate of the third FET Q3 is high and hence the power is now cut, e.g., via signaling the power circuitry 160 to cut the power. Once the power is cut, the GPIO signal from the controller 115 is also lost.

In various embodiments, although the power is cut, the latch circuit U40 can latch to the previous state (e.g., high voltage level) and wait for the PWDIS signal to transition low, e.g., to a low voltage level. Once the PWDIS signal transitions to the low voltage level, the first drain of the first FET in Q1 also transitions to the low voltage level. This means the gate of the third FET Q3 transitions back to the low voltage level again and hence the power is reconnected (e.g., cycled back on) to the controller 115 and the storage device 130.

Other values of the components of the power disable circuit 150 can be employed to adapt differing voltage levels for different implementations, e.g., for a different storage device 130 or 140. As discussed, the circuitry of FIG. 3A can be updated for reverse logic in which a first or high voltage level is swapped with a second or low voltage level. While the implementation of FIGS. 3A-3B is for a five volt input implementation, another such different implementation may be adapted for a 3.3 voltage input or the like.

With reference to FIG. 3B, the power disable circuit 150 can include the voltage supervisor U43 to power, through VCC, the latch circuit U40 after the PGIN signal is at a high voltage level, which will enable the latch circuit U40 to come up in a known state. If the latch circuit is powered up before PGIN comes up, the D-latch outputs to an unknown or undetermined state, e.g., due to floating inputs. The voltage supervisor U43 enables the controller 115 and storage device 130 to power up irrespective of the state of PWDIS signal.

TABLE 2

| | PWDIS_CONN | PWDIS_EN (from Controller 115) | LATCH_EN (MP5505 PGIN) | LATCH_OUT | EFUSE_EN | Comments |
|---|---|---|---|---|---|---|
| Cold Boot | 0 | 0 | 0 | 0 | 1 | Always start on a cold boot regardless of PWDIS signal state. |
| | 1 | 0 | 0 | 0 | 1 | |
| Controller Active (FW) | 0 | 0 | 1 | 0 | 1 | Normal op condition. Controller has not enabled HW monitoring. Host has not required a power down. |
| | 1 | 0 | 1 | 0 | 1 | Host has requested power down. Controller has determined it is not valid and has not enabled HW monitoring. |
| Controller Active (HW) | 0 | 1 | 1 | 1 | 1 | Controller has handed off PWDIS signal monitoring to HW. Host has not requested power down. |
| | 1 | 1 | 1 | 1 | 0 | Controller has handed off PWDIS signal monitoring to HW. Host has not requested power down. |
| SSD Power Down after Active State (HW) | 0 | 0 | 0 | 1 | 1 | As soon as PWDIS signal is negated, power to SSD is restored. |
| | 1 | 0 | 0 | 1 | 0 | If PWDIS signal remains |

TABLE 2-continued

| PWDIS_CONN | PWDIS_EN (from Controller 115) | LATCH_EN (MP5505 PGIN) | LATCH_OUT | EFUSE_EN | Comments |
| --- | --- | --- | --- | --- | --- |
| | | | | | high, the power to SSD to continue to be disconnected. |

More specifically, the net PGIN signal can come from power circuitry 160 and transition to a high voltage level once the input power to the storage device 130 is stable. It can take approximately 100 ms to stabilize. The voltage supervisor U43 can provide a delay of approximately 200 ms after which the latch circuit U40 is powered up. When the latch circuit U40 is powered, the PGIN signal will be high and the GPIO from the controller will be low. This means that the output at pin Q of the latch circuit U40 will be low and the memory sub-system 110 turns ON irrespective of the state of the PWDIS signal (e.g., PWDIS_CONN in FIG. 3A). Without the use of the voltage supervisor U43, the storage device 130 may not power up the first time if the PWDIS signal is high by mistake at the host side.

With reference to FIG. 3C, in a 3.3 volt system, a load switch S4 can be placed between the third FET Q3 and the power circuitry 160, which can include a MP5505 or other high-efficiency energy storage and management unit for SSD applications in some embodiments. The MP5505 component is to turn off the controller 115 and the memory device 130 or 140 once the PWDIS signal is asserted after having been negated for a length of time satisfying a threshold criterion, as discussed herein. Table 2 has a truth table descriptive of various signal values and functions, including those associated with the PWDIS signal (PWDIS_CONN), the PWDIS enable signal (PWDIS_EN) from the controller 115, the latch enable signal (LATCH_EN) of the power circuitry 160, a latch out signal (LATCH_OUT), and an electronic fuse enable signal (EFUSE_EN).

Figure 4:
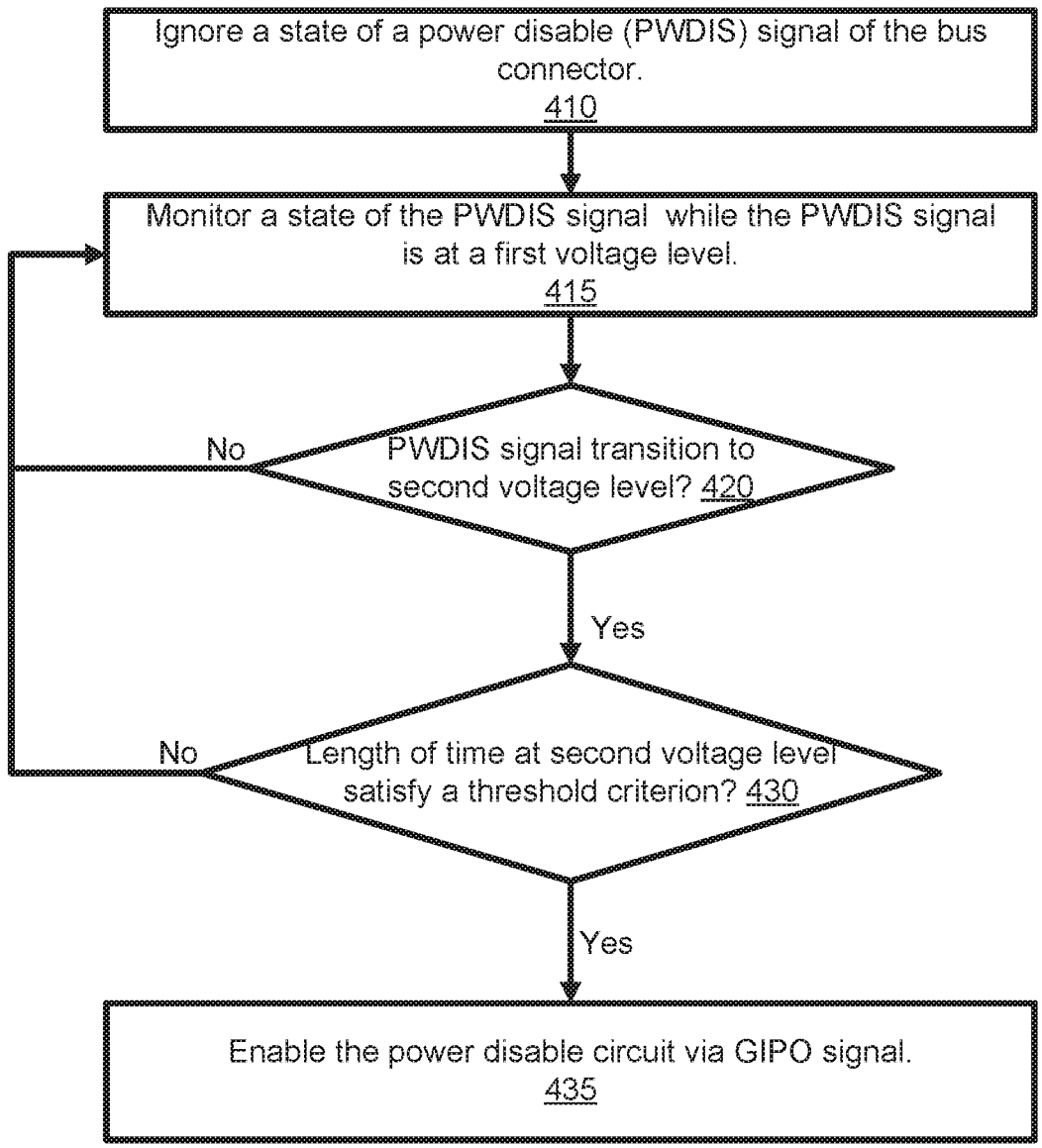
FIG. 4 is a flow diagram of an example method for power disable control of a memory sub-system according to an embodiment.

FIG. 4 is a flow diagram of an example method 400 for power disable control of the memory sub-system 110 according to an embodiment. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the controller 115 (e.g., the PWDIS connector monitor 113) of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

With reference to FIG. 4, at operation 410, the processing logic ignores a state of a power disable (PWDIS) signal of the bus connector 124. At operation 415 and after the memory device 130 or 140 is powered on, the processing logic monitors the state of the PWDIS signal of the bus connector 124 while the PWDIS signal is at a first or high voltage level. This high voltage level may be understood to be a range of voltages, such as between about 2.1 volts and 3.6 volts. As discussed previously, if the processing logic were updated to be triggered by the opposite voltage level, this first voltage level could be a low voltage level and the transitions to a second voltage level could be from a low voltage level to a high voltage level. For purposes of the present explanation and following the PWDIS protocol of Table 1, it is assumed that the PWDIS signal is initially monitored at a high voltage level for a transition to a low voltage level that can indicate a power off signal.

With continued reference to FIG. 4, at operation 420, the processing logic detects whether the PWDIS signal has transitioned to a second or low voltage level. The low voltage level can also be a range of voltage levels, such as between about −0.5 volts and 0.7 volts. If no transition has occurred, at operation 415, the processing logic continues monitoring for the transition to the second or low voltage level. If a transition has occurred to the low voltage level, at operation 430, the processing logic determines whether a length of time for which the PWDIS signal has been at the low voltage level satisfies a threshold criterion. To satisfy the threshold criterion, the length of time is at least 30 seconds for the PWDIS protocol explained in Table 1 as the PWDIS negated hold time ($T_{HN}$), but can be longer, such as between 30 and 60 seconds or longer. The length of time can even be less than 30 seconds (e.g., 15 seconds) if designed for a different power disable protocol. The processing logic can use a timer or other clock logic to track how much time the PWDIS signal has been at the second or low voltage level.

In various embodiments, if the PWDIS signal transitions back to the high voltage level before the length of time satisfies the threshold criterion, at operation 415, the processing logic continues to monitor the PWDIS signal. If the length of time for which the PWDIS signal has been at the low voltage level has satisfied the threshold criterion, at operation 435, the processing logic enables the power disable circuit 150 via a GIPO or other enablement signal. Once the power disable circuit 150 is enabled, the power disable circuit 150 can take over monitoring and, in response to the PWDIS signal transitioning back to the first or high voltage level, signal to the power circuitry 160 to cut power to the processing device and the memory device. One embodiment for doing this is illustrated in FIG. 3A and the process flow is discussed in more detail with reference to FIG. 5B.

Figure 5A:
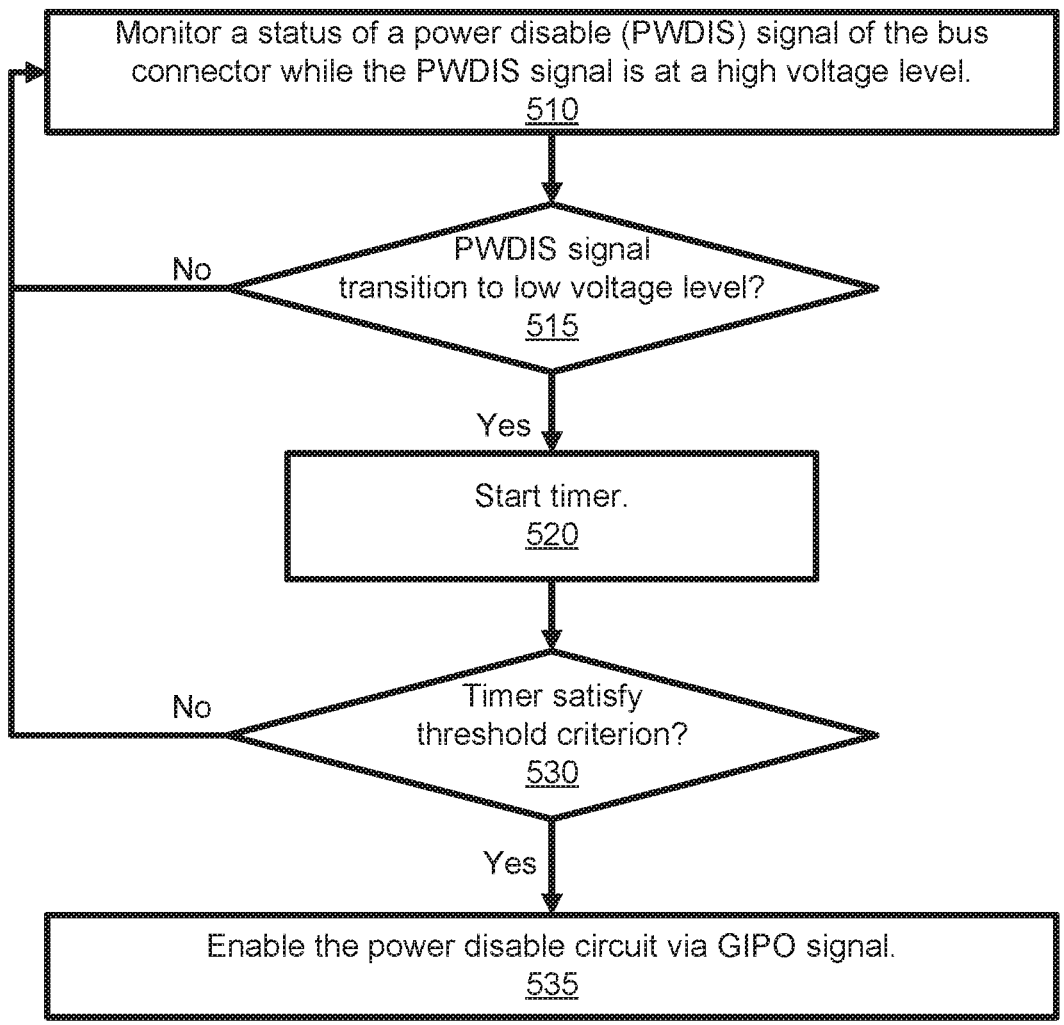
FIGS. 5A-5B are a flow diagram of an example method for power disable control of a memory sub-system according to various embodiments.

FIG. 5A is a flow diagram of an example method 500A for power disable control of the memory sub-system 110 according to various embodiments. The method 500A can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500A is performed by the controller 115 (e.g., the PWDIS connector monitor 113) of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

With reference to FIG. 5A, at operation 510, the processing logic monitors a status of a power disable (PWDIS) signal of the bus connector 124 while the PWDIS signal is at a high voltage level. This high voltage level may be understood to be a range of voltages, such as between about 2.1 volts and 3.6 volts, although other voltage range is envisioned. At operation 515, the processing logic determines whether the PWDIS signal has transitioned to a low voltage level. The low voltage level can also be a range of voltage levels, such as between about −0.5 volts and 0.7 volts, although other voltage ranges are envisioned. If no, at operation 510, the processing logic continues to monitor the status of the PWDIS signal. If yes, at operation 520, the processing logic starts the timer 113A to track how long the PWDIS signal remains at the low voltage level.

With continued reference to FIG. 5A, at operation 530, the processing logic determines whether the timer 113A has reached a length of time satisfying a threshold criterion (such as 30 seconds in one embodiment, 45 seconds in another embodiment, or 60 seconds in still a further embodiment, for example). If the timer 113A has not satisfied the threshold criterion, at operation 510, the processing logic continues monitoring the status of the PWDIS signal level. If the timer 113A has satisfied the threshold criterion, at operation 535, the processing logic enables the power disable circuit 150 via the GPIO (or other enablement) signal. Once the power disable circuit 150 is enabled, the power disable circuit 150 can take over monitoring and, in response to the PWDIS signal transitioning back to the first or high voltage level, signal to the power circuitry 160 to cut power to the processing device and the memory device. This functionality is discussed in more detail with reference to FIG. 5B by way of example.

Figure 5B:
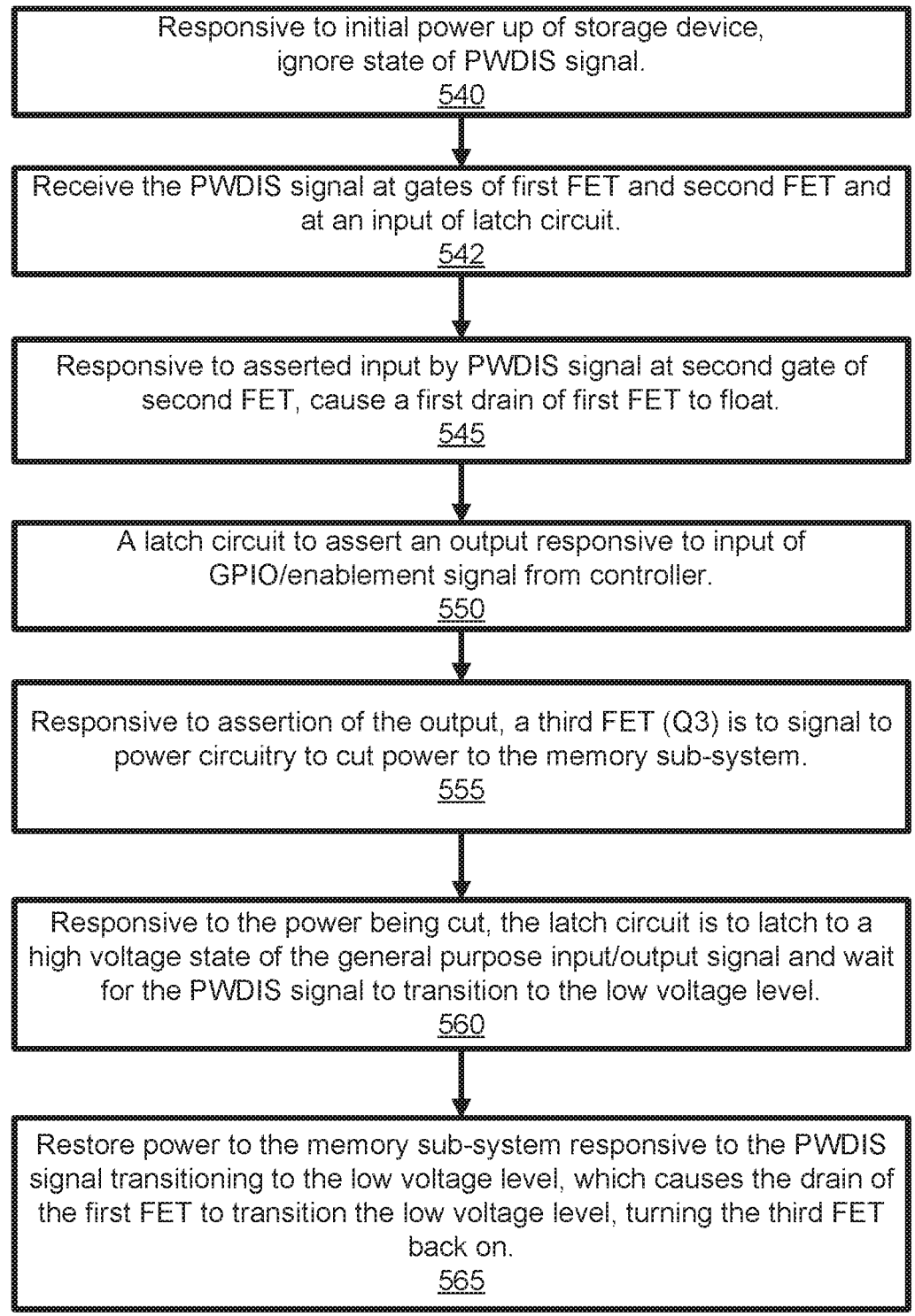

FIG. 5B is a flow diagram of an example method 500B for power disable control of the memory sub-system 110 according to various embodiments. The method 500B can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500B is performed by the power disable circuit 150 of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

With reference to FIG. 5B, at operation 540, the processing logic ignores the state of the PWDIS signal responsive to initial power up of the storage device. Ignoring the state of the PWDIS during initial power up can enable use of the disclosed power disable circuit 150 in a legacy memory sub-system 110 not intended to support the disclosed power disable feature (see FIG. 2 for PWDIS support/enable checks). At operation 542, the processing logic receives the PWDIS signal at gates of the first FET and second FET and at an input of the latch circuit U40.

In various embodiments, at operation 545, the processing logic causes a drain of a first FET to float responsive to an asserted input (from PWDIS signal) at a second gate of a second FET that has its source mutually coupled with a source of the first FET. At operation 550, the latch circuit U40 of the processing logic asserts an output responsive to an input of a GPIO (or other enablement) signal from the controller 115 (see FIG. 4 and FIG. 5A). At operation 555, the third FET (Q3) of the processing logic signals to the power circuitry to cut power to the memory sub-system 110, e.g., to the controller 115 and the memory device 130 or 140, responsive to assertion of the output of the latch circuit. As discussed with reference to FIG. 3A, the third FET (Q3) can have its gate coupled to the output (pin Q) of the latch circuit U40 and to the first drain (D1) of the first FET in component Q1. The third source (S3) of the third FET is coupled to ground and the third drain (D3) of the third FET is coupled to the power circuitry 160, e.g., the MP5505, a high-efficiency energy storage and management unit for SSD applications.

With continued reference to FIG. 5B, at operation 560, the latch circuit U40 of the processing logic latches a high voltage state of the GPIO signal and waits for the PWDIS signal to transition to the low voltage level. This allows the power disable circuit 150 to know the last state of the GPIO (or other enablement) signal after power has been cut to the controller 115. At operation 565, the third FET (Q3) of the processing logic restores the power to the controller 115 and the memory device 130 or 140 responsive to the PWDIS signal transitioning to a low voltage level, which causes the drain of the first FET to transition back to a low voltage level, turning the third FET back on.

Figure 6:
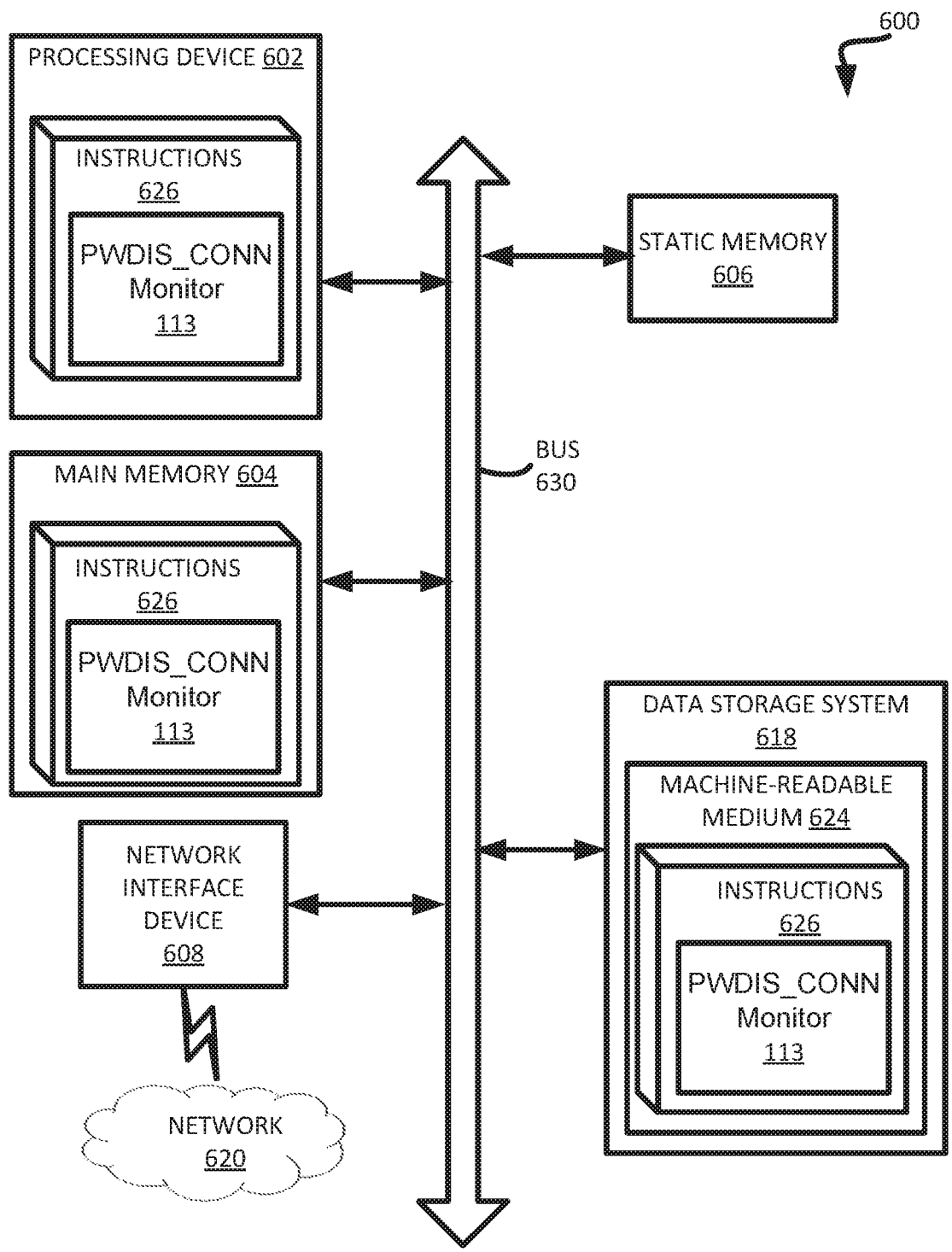
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIGS. 1A-1B) that includes, is coupled to, or utilizes a memory sub-system (e.g., the memory sub-system 110 of FIGS. 1A-1B) or can be used to perform the operations of a controller 115 (e.g., to execute an operating system to perform operations corresponding to the PWDIS_CONN monitor 113 of FIG. 1B). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIGS. 1A-1B.

In one embodiment, the instructions 626 include instructions to implement functionality corresponding to an error determining component (e.g., the PWDIS_CONN monitor 113 of FIG. 1B). While the machine-readable storage medium 624 is shown in an example embodiment to be a single medium, the term "non-transitory machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device;
a power disable circuit coupled to a bus connector of a host system and to power circuitry adapted to power on and off the memory device; and
a processing device operatively coupled to the bus connector, to the power disable circuit, and to the memory device, wherein the processing device is to:
monitor a state of a power disable (PWDIS) signal of the bus connector while the PWDIS signal is at a first voltage level;

in response to the PWDIS signal transitioning to a second voltage level, determine whether a length of time for which the PWDIS signal has been at the second voltage level satisfies a threshold criterion; and in response to the length of time for which the PWDIS signal has been at the second voltage level satisfying the threshold criterion, enable the power disable circuit with a general purpose input/output signal; and wherein the power disable circuit comprises:
a first field effect transistor (FET) and a second FET with sources mutually coupled and gates to receive the PWDIS signal, wherein, in response to an asserted input of the PWDIS signal at a second gate of the second FET, a drain of the first FET is left floating;
a latch circuit to assert an output in response to the general purpose input/output signal; and
a third FET coupled to the drain of the first FET and to the output of the latch circuit, wherein in response to assertion of the output of the latch circuit, the third FET is to signal to the power circuitry to cut power to the processing device and the memory device.

2. The system of claim 1, wherein to determine the length of time for which the PWDIS signal has been at the second voltage level, the processing device is to initiate and track a timer, and wherein the length of time is between 30 and 60 seconds to satisfy the threshold criterion.

3. The system of claim 1, wherein once enabled, the power disable circuit is to, in response to the PWDIS signal transitioning back to the first voltage level, signal to the power circuitry to cut power to the processing device and the memory device.

4. The system of claim 1, wherein, in response to the power being cut, the latch circuit is to latch to a voltage state of the general purpose input/output signal and wait for the PWDIS signal to transition to the second voltage level, and wherein, in response to the PWDIS signal going to the second voltage level, the drain of the first FET is to transition to the second voltage level, which is to cause the third FET to signal the power circuitry to restore the power.

5. The system of claim 1, further comprising a combination of a resistor and capacitor coupled to a first gate of the first FET, wherein in response to the asserted input of the PWDIS signal at the first gate, the resistor and capacitor are to delay the asserted input of the PWDIS signal to perform deglitch.

6. The system of claim 1, wherein during initial power up of the memory device, the power disable circuit ignores the state of the PWDIS signal.

7. The system of claim 1, wherein the first voltage level is a high voltage level and the second voltage level is a low voltage level.

8. A system comprising:
power circuitry to power on and off a memory sub-system;
a power disable circuit coupled to a bus connector of a host system and to the power circuitry; and
a processing device, of the memory sub-system, comprising a timer and operatively coupled to the bus connector, to the power disable circuit, and to a memory device of the memory sub-system, wherein the processing device is to:
ignore, during initial power up of the memory device, a state of a power disable (PWDIS) signal of the bus connector;

after the memory device is powered on, monitor the state of the PWDIS signal of the bus connector while the PWDIS signal is at a high voltage level;
in response to the PWDIS signal transitioning to a low voltage level, initiate the timer; and
in response to the timer satisfying a threshold criterion, enable the power disable circuit with an enablement signal; and wherein the power disable circuit comprises:
a first field effect transistor (FET) and a second FET with sources mutually coupled and gates to receive the PWDIS signal, wherein, in response to an asserted input of the PWDIS signal at a second gate of the second FET, a drain of the first FET is left floating;
a latch circuit to assert an output in response to the enablement signal; and
a third FET coupled to the drain of the first FET and to the output of the latch circuit, wherein in response to assertion of the output of the latch circuit, the third FET is to signal to the power circuitry to cut power to the memory sub-system.

9. The system of claim 8, wherein the threshold criterion is between 30 and 60 seconds.

10. The system of claim 8, wherein, once enabled, the power disable circuit is to:
monitor for the PWDIS signal transitioning back to the high voltage level; and
in response to the PWDIS signal transitioning back to the high voltage level, signal to the power circuitry to cut power to the memory sub-system.

11. The system of claim 8, wherein, in response to the power being cut, the latch circuit is to latch to a high voltage state of the enablement signal and wait for the PWDIS signal to transition to the low voltage level, and wherein, in response to the PWDIS signal transitioning to the low voltage level, the drain of the first FET is to transition to the low voltage level, which is to cause the third FET to signal the power circuitry to restore the power.

12. The system of claim 8, further comprising a combination of a resistor and capacitor coupled to a first gate of the first FET and a second resistor between the power and a drain of the second FET, to provide deglitch to a falling edge of the PWDIS signal when transitioning to the low voltage level to trigger power restore.

13. A method comprising:
operating a system comprising a power disable circuit coupled to a bus connector of a host system and to power circuitry, and a processing device operatively coupled to the bus connector, to the power disable circuit, and to a memory device, wherein operating the system comprises:
ignoring, during initial power up of the memory device, a state of a power disable (PWDIS) signal of the bus connector;
after the memory device is powered on, the processing device monitoring the state of the PWDIS signal of the bus connector while the PWDIS signal is at a high voltage level;
in response to the PWDIS signal transitioning to a low voltage level, determining whether a length of time for which the PWDIS signal has been at the low voltage level satisfies a threshold criterion; and
in response to the length of time for which the PWDIS signal has been at the low voltage level satisfying the threshold criterion, the processing device enabling the power disable circuit with a general purpose input/output signal; and wherein the power disable circuit comprises a first field effect transistor (FET) and a second FET with sources mutually coupled, a latch circuit, and a third FET coupled to a drain of the first FET and to the memory device and the processing device, wherein operating the system further comprises:

receiving the PWDIS signal at gates of the first FET and the second FET and at an input of the latch circuit;

in response to an asserted input of the PWDIS signal at a second gate of the second FET, causing the drain of the first FET to be left floating;

asserting an output of the latch circuit in response to the general purpose input/output signal; and signaling, by the third FET in response to the asserting the output of the latch circuit, the power circuitry to cut power to the processing device and the memory device.

14. The method of claim 13, wherein operating the system further comprises:

determining whether power disable (PWDIS) is supported by the system;

determining whether the PWDIS is enabled by the system; and enabling the monitoring of the state of the PWDIS signal in response to determining that the PWDIS is supported and enabled.

15. The method of claim 13, further comprising determining the length of time for which PWDIS signal has been at the low voltage level by initiating and tracking a timer, and wherein the satisfying the threshold criterion comprises the timer reaching between 30 and 60 seconds.

16. The method of claim 13, wherein operating the system further comprises, once enabled, the power disable circuit, in response to the PWDIS signal transitioning back to the high voltage level, signaling to the power circuitry to cut power to the processing device and the memory device.

17. The method of claim 13, wherein, in response to cutting the power, operating the system further comprises:

latching the latch circuit to a high voltage state of the general purpose input/output signal;

waiting for the PWDIS signal to transition to the low voltage level; and in response to the PWDIS signal transitioning to the low voltage level, causing voltage at the drain of the first FET to transition to the low voltage level, triggering the third FET to signal the power circuitry to restore the power.

* * * * *